United States Patent [19]

Martin et al.

[11] 4,190,446
[45] Feb. 26, 1980

[54] PHOTOCROSSLINKABLE, HIGH-TEMPERATURE-RESISTANT POLYMERS AND THEIR USE IN COLOR IMAGING DEVICES

[75] Inventors: Thomas W. Martin, Rochester; Mohammad A. Sandhu, Pittsford; Dennis J. Savage, Rochester, all of N.Y.

[73] Assignee: Eastman Kodak Company, Rochester, N.Y.

[21] Appl. No.: 940,057

[22] Filed: Sep. 6, 1978

[51] Int. Cl.$^2$ .................. G03C 5/00; G03C 1/68; G03F 5/00
[52] U.S. Cl. .................. 430/25; 430/292; 430/311; 358/44
[58] Field of Search .......... 96/35.1, 118, 35, 36, 96/36.1, 38.2, 117, 115 R, 77; 358/253, 205, 41, 44; 313/65–68, 36, 371–374; 350/166, 162 SF, 317; 427/248 H

[56] References Cited

U.S. PATENT DOCUMENTS

| | | | |
|---|---|---|---|
| 2,681,857 | 6/1954 | Rogers | 96/118 |
| 2,750,524 | 6/1956 | Braham | 96/116 X |
| 4,081,277 | 3/1978 | Brault et al. | 96/38.2 |

*Primary Examiner*—Edward C. Kimlin
*Attorney, Agent, or Firm*—J. Jeffrey Hawley

[57] ABSTRACT

Photocrosslinkable, organic solvent-soluble polymers having a Tg greater than 200° C. are disclosed. The polymers contain sufficient radiation-sensitive crosslinkable units to render the polymers insoluble in organic solvents on exposure to radiation to which the crosslinkable units are sensitive. Also disclosed are supports, particularly supports having a radiation-sensitive surface, having thereon a layer of the described photocrosslinkable polymers. The polymers are capable of receiving heat-transferable dyes and are useful in forming color filter arrays for solid-state imaging devices. A particularly convenient method of forming solid-state color imaging devices having a layer containing an array of color filters is also disclosed.

6 Claims, No Drawings

PHOTOCROSSLINKABLE, HIGH-TEMPERATURE-RESISTANT POLYMERS AND THEIR USE IN COLOR IMAGING DEVICES

BACKGROUND OF THE INVENTION

Field of the Invention

The present invention relates to photocrosslinkable, organic solvent-soluble polymers having a Tg greater than 200° C. In another aspect, it relates to negative-working, photocrosslinkable polymers that can be coated on a variety of supports to form useful elements such as solid-state color imaging devices having color filter arrays.

Description Relative to the Prior Art

Photofabrication of various devices using light-sensitive polymers is well-known in the art. Typical devices made using photofabrication techniques include cathode-ray screens having filter elements in a light-absorbing matrix, integrated circuits, various semiconductor devices and the like. The environment in which many of these devices are made or used frequently exposes the device to high temperature. Unfortunately, known light-sensitive polymers can be adversely affected by these high temperatures.

One method of making a color cathode-ray tube screen is described in U.S. Pat. No. 3,884,695. In this method, a negative, photosensitive resist composition is used in which is formed a window pattern. The pattern is then overcoated with a uniform layer of heat-formable optical filter material. Because of the thermal limitations of known photoresists, it was found necessary to protect these resists from the temperatures and materials encountered in the process with thermally and chemically inactive components. Thus, it was necessary to add to the photosensitive material additives such as aluminum silicate, zinc oxide and the like.

Non-light-sensitive, high-temperature-resistant, i.e., high-Tg, polymers are also known in the art. These polymers are used, for example, as protective coatings, as supports for elements which are used in recognized high-temperature processes such as the thermographic processes, and the like. A recent patent, U.S. Pat. No. 4,081,277, has described the use of high-temperature-resistant polymer layers which are superposed on a radiation-sensitive surface. An array of filter elements can be formed in the high-temperature-resistant polymer by heat-transferring dyes into the polymer through window areas formed in a photoresist which is coated on the polymer layer. High-temperature-resistant polymers are preferred in this process because, for best results, the dyes should be transferred at a temperature below the Tg of the polymer. Increasing the Tg of the polymers widens the selection of useful dyes.

The radiation-sensitive surface of a device as described in U.S. Pat. No. 4,081,277 preferably comprises a semiconductive wafer surface having thereon an array of photosensors. A color filter array which is formed in the heat-resistant polymer using the heat-transferable dyes is in microregistration with the array of photosensors. The surface also contains bonding pad areas which are those areas where it is desired to form electrical contacts to the device. It is readily apparent that the presence of the high-temperature-resistant dye-receiving polymers over the bonding pad areas will interfere with the electrical connections. One method of uncovering the bonding pad areas is to apply a photoresist to the polymer layer; expose the photoresist and develop it so as to form window areas corresponding to the bonding pad areas; and then attempt to etch away the high-temperature-resistant polymer using a suitable solvent through these window areas. Unfortunately, this turns out to be quite difficult because the solvent tends to undermine the photoresist and etch away areas of the polymer layer where the color filter elements have been or will be formed. In order to etch only those areas above the bonding pads, it is necessary to control the etching extremely carefully by careful control of the solvent concentration and other factors. This adds yet another critical step to an already complex process.

It is well-known that crosslinking of polymers decreases their permeability to liquids and gases. (See, for example, "The Permeability of Polymers to Gases, Vapors, and Liquids", R. W. Richards, National Technical Information Services, U.S. Dept. of Commerce, Technical Report No. 135 (AD-767-627), pp. 16–17 (1973).) Therefore, one would expect that rendering a polymer crosslinkable would also destroy its usefulness as a dye receiver in the process of U.S. Pat. No. 4,081,277 because its permeability to dye would be reduced. There is no reference which provides a photocrosslinkable high-temperature-resistant polymer, and certainly not such a polymer which is dyeable.

SUMMARY OF THE INVENTION

Contrary to what one would expect from the teachings of the prior art, we have found that photocrosslinkable, high-temperature-resistant polymers retain sufficient permeability so that they can be dyed and are useful in the process described in above-mentioned U.S. Pat. No. 4,081,277. The polymers of the present invention are photocrosslinkable, organic solvent-soluble polymers having a Tg greater than 200° C. The polymers contain sufficient radiation-sensitive, crosslinkable units to render the polymers insoluble in organic solvents on exposure to radiation to which the crosslinkable units are sensitive.

The polymers of the present invention can be coated on a wide variety of surfaces to form useful elements. For example, they can be coated on glass as in the manufacture of cathode-ray tubes; metals as in the fabrication of a variety of electrical devices such as circuit boards; and the like. Thus, in another aspect of the present invention there is provided an element comprising a support having thereon a layer comprising the described crosslinkable polymer.

The polymers described above surprisingly retain their dyeability even after being crosslinked. Thus, a dyed element comprising a support having thereon a layer of the described polymer containing a heat-transferable dye can be formed. A particularly useful embodiment according to this aspect of the invention is a color imaging device comprising:

(a) a radiation-sensitive surface and, superimposed thereon,
(b) a layer of the described polymer containing a planar array of filter elements, wherein each of said filter elements contains a heat-transferable dye.

In yet another aspect of the present invention, there is provided a method of producing a color imaging device. The device is of the type which comprises:

(a) a semiconductive wafer having a surface comprising:

(i) an array of charge-handling semiconductive photosensors and
(ii) bonding pad areas and
(b) a layer of a polymer superimposed with said surface, wherein the polymer layer:
(i) contains a planar array of filter elements in microregistration with the array of photosensors, wherein each of the elements contains a heat-transferable dye and
(ii) has window areas which correspond with the bonding pad areas.

The method comprises the steps of:
(1) coating the surface of the semiconductive wafer with a layer of a polymer which is a photocrosslinkable organic solvent-soluble polymer having a Tg greater than 200° C., wherein said polymer contains sufficient radiation-sensitive crosslinkable units to render the polymer insoluble in organic solvents on exposure to radiation to which the crosslinkable units are sensitive,
(2) exposing the polymer layer to a pattern of radiation which represents the negative of the bonding pad areas so as to crosslink the polymer layer except in those areas corresponding to said bonding pad areas,
(3) contacting the polymer layer with an organic solvent so as to remove the uncrosslinked polymer layer in areas corresponding to said bonding pad areas, and
(4) transferring dye into the crosslinked polymer layer so as to form filter elements in microregistration with the photosensors.

DETAILED DESCRIPTION OF THE INVENTION

The polymers of the present invention are photocrosslinkable, organic solvent-soluble polymers having a glass transition temperature (Tg) greater than 200° C. By "organic solvent-soluble" we mean that a thin layer of the polymer on a suitable support can be removed by contacting the layer with an organic solvent for a reasonable time at a reasonable temperature. Typically, 10-micron layers of the polymers of the present invention (before crosslinking) can be removed by contacting with the organic solvent at room temperature in less than about 10 min. When we refer to a polymer as being "insoluble in organic solvents" we mean that a similar layer of the crosslinked polymer is substantially unaffected by contact with an organic solvent under similar conditions. Useful organic solvents in which the uncrosslinked polymers of the present invention are soluble include 1,2-dichloroethane, 1,1-dichloroethane, 1,1,2-trichloroethane, tetrachloroethane, chlorobenzene, cyclohexanone, dioxane, 2-methoxyethyl acetate and mixtures thereof.

The polymers of the present invention are condensation polymers which can take a variety of forms. For example, they can be polyesters, polycarbonates, polysulfonates, polyethers, polyamides or mixed polyesteramides. The condensation polymers of the present invention comprise repeating units derived from a diacid component or functional derivatives thereof and a second component which can be a diol, a diamine or functional derivatives thereof. The polymers of the invention contain at least two recurring units. One unit provides the photocrosslinkability of the polymer while the other unit provides the polymer with its high-temperature resistance, e.g., its high Tg. Either or both components can be the dicarboxylic acid component or functional derivatives thereof while the other component is selected so as to produce the desired condensation polymer.

The light-sensitive component can be either part of the polymer backbone or pendent therefrom. Thus, by the term "recurring units" we mean either of these embodiments. The light-sensitive component can comprise from 5–50 and preferably from 15–35 mole percent of radiation-sensitive, crosslinkable recurring units derived from diacids, diols or functional equivalents thereof. Preferred crosslinkable recurring units are selected from the group consisting of units having the formulae:

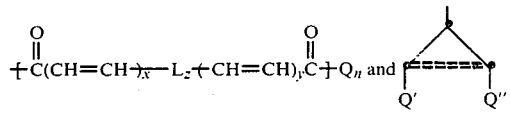

wherein:
x = 0 or 1;
y = 0 or 1;
z = 0 or 1;
q = 0 or 1; and
L is a linking group; with the proviso that, when both of x and y are 0, z is 1 and L is light-sensitive. The value of q depends on whether the recurring unit is pendant (q = 1) or part of the polymer backbone (q = 0). Q, when taken together with the adjacent carbonyl group, represents the atoms necessary to complete a terminal ester group. Thus, Q can be groups such as methoxy, ethoxy, phenoxy and the like. Q' and Q" are independently selected from the group consisting of hydrogen, alkyl having from 1–6 carbon atoms such as methyl, ethyl, isopropyl and the like, and aryl having from 6–12 carbon atoms including substituted aryl such as phenyl, naphthyl, 4-chlorophenyl, tetrahydronaphthyl, 4-(phenylsulfonyl)phenyl, 4-phenoxyphenyl), biphenylyl, 4-ethylphenyl, 4-methoxyphenyl, 2-methoxynaphthyl and the like. Where L is to be light-sensitive, it can be selected from a variety of divalent cyclic or heterocyclic units derived from nuclei such as arylmethyleneindene, furanone, cyclohexene, cyclohexadiene and the like. Where it is not required that L be light-sensitive, it can be any suitable linking group. A particularly preferred linking group is phenylene. Other useful linking groups include straight- and branched-chain alkylene radicals (e.g., ethylene, trimethylene, neopentylene, etc.), cycloalkylene radicals (e.g., cyclohexalene), cycloalkylenebisalkylene radicals (e.g., 1,4-cyclohexalenedimethylene), arylene radicals (e.g., phenylene) and hydrocarbon-oxy-hydrocarbon radicals such as alkylene-oxy-alkylene, alkylene-oxy-cycloalkylene-oxy-alkylene, and the like. The presently preferred radiation-sensitive photocrosslinkable unit is phenylenediacrylate.

Useful groups conforming to the above structures are well-known in the art and are described in the following references: phenylenediacrylates in U.S. Pat. Nos. 3,030,208, 3,929,489, 3,622,320 and 3,707,373 and British Pat. No. 1,470,059; polycarbonates in U.S. Pat. No. 3,453,237; muconic acid derivatives in U.S. Pat. No. 3,615,434; cinnamylidenemalonates appended to the polymer backbone in U.S. Pat. No. 3,873,505; cyclohexadienes in U.S. Pat. No. 3,776,737; indenes and furanones in U.S. Pat. Nos. 3,627,732, 3,677,754, 3,694,411 and 3,748,144; cyclohexenes in British Pat. No. 1,470,059; and cyclopropenes in U.S. Pat. Nos. 3,779,989 and 3,782,938.

The polymers of the present invention, in addition to the unit which provides photocrosslinkability, also contain a unit which provides high-temperature resistance. That is, the polymers should contain sufficient high-temperature-resistant units so that the Tg of the un-crosslinked and, of course, the crosslinked polymer is above 200° C. The polymers meeting this criteria typically comprise from 5–65, and preferably from 15–50, mole percent recurring units which are high-temperature-resistant units derived from dicarboxylic acids, organic diols and their derivatives. Useful derivatives include the corresponding acids, acid chlorides, esters or anhydrides. Useful high-temperature-resistant units are described, for example, in the following references which are hereby incorporated by reference:

(A) The phenylindan dicarboxylates of Hamb, U.S. Pat. No. 3,634,089; the phenylindan diols of Wilson, Research Disclosure, 11833, February, 1974, and U.S. Pat. Nos. 3,803,096, 3,859,364 and 3,886,124; the phenylindan diamines of Wilson, U.S. Pat. Nos. 3,897,253 and 3,915,939; the polyesteramide precursors of Wilson, Research Disclosure, 12833, December, 1974; and the hydrogenated phenylindans of Wilson and Hamb, U.S. Pat. Nos. 3,769,264, 3,842,042 and 3,873,320; all of which provide recurring units in condensation polymers of the formulae:

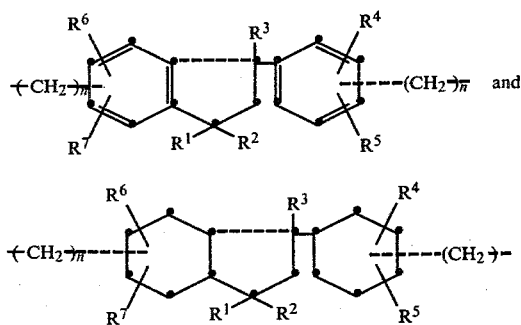

wherein $R^1$ and $R^3$ are independently selected from the group consisting of hydrogen and alkyl radicals of from 1–6 carbon atoms; $R^2$ is an alkyl radical of from 1–6 carbon atoms; $R^4$, $R^5$, $R^6$ and $R^7$ are independently selected from the group consisting of hydrogen, aryl radicals, halogen atoms, nitro radicals, cyano radicals, amino radicals and alkoxy radicals; and n is 0 or 1.

(B) The 1,1'-spirobiindan dicarboxylates of Hamb and Wilson, U.S. Pat. No. 3,725,070; the 1,1'-spirobiindan-bis(oxyacetates) of Research Disclosure, 9830, June, 1972, which provide recurring units in condensation polymers of the structure:

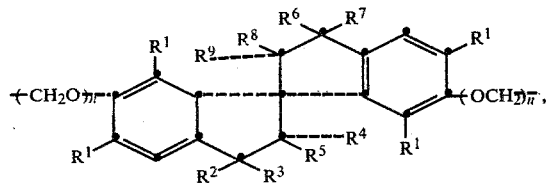

wherein each $R^1$ independently is selected from the group consisting of hydrogen atoms or alkyl radicals having 1–12 carbon atoms; $R^2$, $R^3$, $R^4$, $R^5$, $R^6$, $R^7$, $R^8$ and $R^9$ are independently selected from the group consisting of hydrogen atoms and alkyl radicals of from 1–5 carbon atoms; and n is 0 or 1.

(C) The 1,1'-spirobiindan-5,5'-diamines of Wilson, Research Disclosure, 13117, March, 1975, which provide recurring units in condensation polymers of the structure:

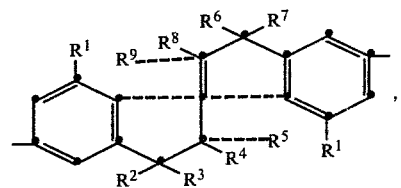

wherein each $R^1$ is independently selected from hydrogen atoms and alkyl radicals of 1–12 carbon atoms; and $R^2$, $R^3$, $R^4$, $R^5$, $R^6$, $R^7$, $R^8$ and $R^9$ are independently selected from the group consisting of hydrogen atoms and alkyl radicals of from 1–5 carbon atoms.

(D) The 2,2'-spirobichromans of Hamb and Wilson, U.S. Pat. No. 3,859,097, which provide recurring units in condensation polymers of the structure:

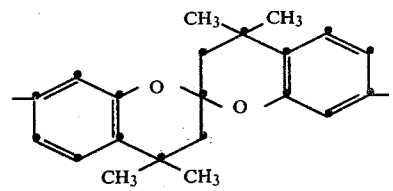

(E) The 7,7-dimethyl-7H-dibenzo[c,h]xanthenes of Hamb and Wilson, U.S. Pat. Nos. 3,859,254 and 3,902,904, which provide recurring units in the polymers of the structure:

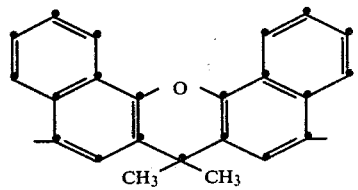

(F) The 9,9-dimethylxanthene-3,6-bis(oxyacetates of Research Disclosure, 9830, June, 1972, which provide recurring units in condensation polymers of the structure:

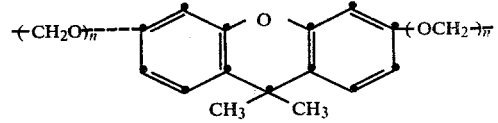

wherein n is 0 or 1.

(G) The xanthylium salts of Wilson, U.S. Pat. No. 3,856,751, which provide recurring units in condensation polymers of the structure:

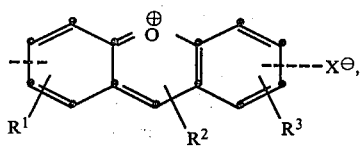

wherein $R^1$, $R^2$ and $R^3$ are hydrogen, alkyl, aryl, halogen, alkoxy or cyano; and $X^\ominus$ is an acid anion.

(H) The 4,4'-(3-phenyl-1-indanylidene)diphenols of Wilson, *Research Disclosure*, 13101, March, 1975, which provide recurring units in condensation polymers of the structure:

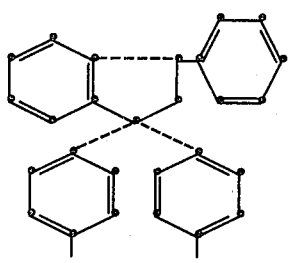

(I) The 4,4'-(hexahydro-4,7-methanoindan-5-ylidene)diphenols of Sandhu, *Research Disclosure*, 13568, July, 1975, which provide recurring units in condensation polymers of the structure:

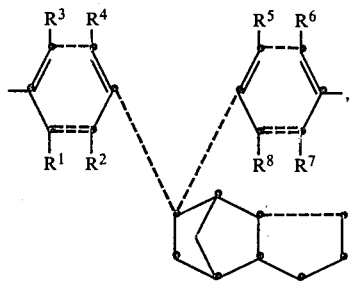

wherein $R^1$, $R^2$, $R^3$, $R^4$, $R^5$, $R^6$, $R^7$ and $R^8$ are independently hydrogen, halogen, cyano, alkyl of 1-8 carbon atoms or alkoxy of 1-8 carbon atoms.

(J) The bisphenols of Conklin and Hamb, *Research Disclosure*, 12012, April, 1974, and the halogenated bisphenols of Sandhu, *Research Disclosure*, 13569, July, 1975, all of which provide recurring units in condensation polymers of the structure:

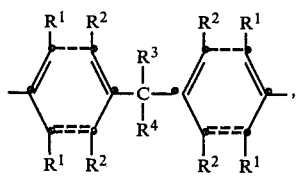

wherein each $R^1$ is hydrogen, halogen, preferably chloro or bromo, alkyl of 1-8 carbon atoms or alkoxy of 1-8 carbon atoms; each $R^2$ is hydrogen, alkyl of 1-8 carbon atoms or alkoxy of 1-8 carbon atoms; and $R^3$ and $R^4$ are alkyl of about 1-6 carbon atoms.

(K) The sulfonyldibenzoates of Sandhu, *Research Disclosure*, 14016, December, 1975, which provide recurring units in condensation polymers of the structure:

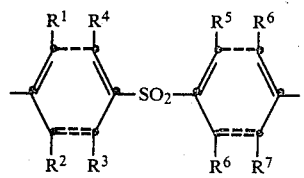

wherein each of $R^1$ through $R^8$ is independently selected from hydrogen, halogen, preferably chloro or bromo, and alkyl of about 1-4 carbon atoms.

(L) The polycyclic norbornanes of *Research Disclosure*, 9207, December, 1971, which provide recurring units in condensation polymers of the structure:

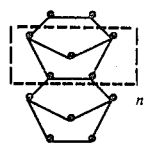

wherein n is 0 to 3.

(M) The 1,2,3,4-tetrahydronaphthalenes of Sandhu, *Research Disclosure*, 13570, July, 1975, which provide recurring units in condensation polymers of the structure:

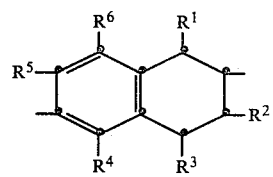

wherein each of $R^1$ through $R^6$ is independently selected from hydrogen, halogen or lower alkyl of 1-4 carbon atoms.

Particularly preferred high-temperature-providing units are those described in (I) above. These are the 4,4'-(hexahydro-4,7-methanoindan-5-ylidene)diphenols. These units form polymers which, when dyed, have dyed areas having extremely sharp edges. Therefore, these units are particularly useful in the formation of solid-state imaging devices where the color filter array superposed over the imaging device must have filter elements having precise dimensions.

As mentioned, the polymers of the present invention comprise from 5-50 mole percent of a light-sensitive unit or units and from 5-65 percent of a unit or units which provide high-temperature resistivity. The exact concentration of each of these units depends on the desired glass transition temperature of the polymer and the desired degree of crosslinkability. The polymer should contain sufficient photocrosslinkable units so that the polymer becomes substantially insoluble in organic solvents when the crosslinking units are exposed to radiation to which they are sensitive. The polymer should contain sufficient high-temperature-resistant units so that the polymer has a glass transition temperature greater than 200° C. Once the specific units are chosen, the exact proportions of components to provide these properties can be determined by simple experiment.

The polymers of the present invention can also contain, if necessary, additional recurring units derived from diacids, diols, diamines and functional equivalents thereof. As is well-known in the art, these additional units can be chosen to balance the physical parameters such as solubility, crystallinity and the like, as desired. The additional component can be any difunctional compound capable of condensing with the other components selected for the polymer. In a preferred form, the additional component can be derived from one or more diols of the formula HO-R-OH wherein R is a divalent organic radical generally having from about 2–12 carbon atoms. R can be, for example, any of the radicals listed for the linking group L in the preferred light-sensitive unit described above.

Preferred polymers of the present invention are polyesters wherein the photocrosslinkable unit is derived from a diacid or its derivatives and the high-temperature-resistant unit is derived from a diol. The preferred polyesters contain phenylene diacrylate and the 4,4'-(hexahydro-4,7-methanoindan-5-ylidene)diphenylene groups described in (I) above. In particular, the preferred polymers conform to the structure:

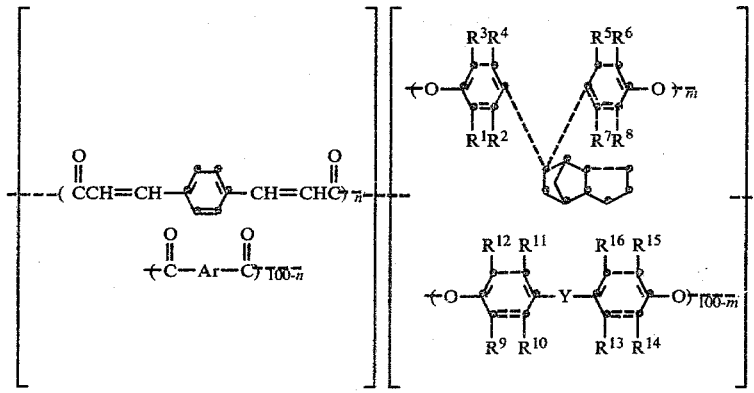

wherein the value of n can range from 10–100 and the value of m can range from 0–100. The subscripts n and m represent acid-component or base-component percentage. Thus, for example, where n is 50, 50% of the acid component of the polyester is phenylenediacrylate. Each of $R^1$–$R^{16}$ is independently selected from the group consisting of hydrogen, halogen, cyano, alkyl and alkoxy, and Y represents sulfonyl, oxy, alkylene of 1–4 carbon atoms, alkylidene, preferably an isopropylidene group, or a cycloalkylidene group such as cyclopentylidene, cyclohexylidene, 2-norbornylidene, 9-fluorinylidene, 2-oxaindan-1-one-3-ylidene and the like. Ar can be 4,4'-sulfonyldiphenylene, 1,2,3,4-tetrahydro-2,6-naphthylene, 4,4'-isopropylidenediphenylene, 1,4-biphenylylene, 2,6-naphthalene or 1,1,3-trimethyl-3-phenylindan-5,5'-ylene, but is preferably m-phenylene or p-phenylene or a mixture of both with or without ring substituents such as halogen, e.g., fluoro, chloro or bromo, or lower alkyl, e.g., having from 1–4 carbon atoms.

Illustrative polymers according to the present invention are as follows:

poly[4,4'-(hexahydro-4,7-methanoindan-5-ylidene)-diphenylene terephthalate-co-1,4-phenylenediacrylate 70:30]

poly[4,4'-(hexahydro-4,7-methanoindan-5-ylidene)-diphenylene terephthalate-co-1,4-phenylenediacrylate 50:50]

poly[4,4'-(hexahydro-4,7-methanoindan-5-ylidene)-diphenylene terephthalate-co-1,4-phenylenediacrylate 10:90]

poly(4,4'-isopropylidenediphenylene 1,1,3-trimethyl-3-phenyl-5,4'-indandicarboxylate-co-1,4-phenylenediacrylate 70:30)

poly(4,4'-isopropylidenediphenylene 4,4'-sulfonyldibenzoate-co-1,4-phenylenediacrylate 50:50)

poly[4,4'-isopropylidene-bis(2,6-dichlorophenylene)isophthalate-co-1,4-phenylenediacrylate 70:30]

poly(1,6-hexylene-4,4'-sulfonyldibenzmide-co-1,6-hexylene-1,4-phenylenediacrylamide) (70:30)

poly(4,4'-isopropylidenedicyclohexylene-4,4'-sulfonyldibenzamido-co-4,4'-isopropylidenedicyclohexylene-1,4-phenylenediacrylamide) (70:30)

poly(4,4'-isopropylidenedicyclohexylene-1,1,3-trimethyl-3-phenyl-5,4'-indandiamido-co-4,4'-isopropylidenedicyclohexylene-1,4-phenylenediacrylamide) (70:30)

poly(1,6-hexylene-1,1,3-trimethyl-3-phenyl-5,4'-indandiamido-co-1,6-hexylene-1,4-phenylenediacrylamide) (70:30)

poly(4,4'-isopropylidenedicyclohexylenefumaramide-co-4,4'-isopropylidenedicyclohexylene-1,1,3-trimethyl-3-phenyl-5,4'-indandiamide) (50:50)

poly[4,4'-isopropylidenebis(3,5-dichlorophenylene)ethylenediacrylamido-co-4,4'-isopropylidenebis(3,5-dichlorophenylene)diacrylate poly[1,4-pentadiene-3-one-1,5-ylenebis(3-methoxyphenylene-co-4,4'-(fluoren-9-ylidene)di(phenylene) (50:50) 1,3-phenylenedisulfonate]

poly[4,4'-cyclopentanone-1,5-diylidenedimethylenebis(3-methoxyphenylene) 1,2,3,4-tetrahydro-2,6-naphthalenedicarboxylate]

poly[4,4'-cyclopentanone-1,5-diylidenedimethylenebis(3-methoxyphenylene) m-benzenedisulfonate-co-1,1,3-trimethyl-3-phenyl-5,4'-indandicarboxylate (50:50)]

poly[4,4'-isopropylidenebis(3,5-dichlorophenylene) m-benzenedisulfonate-co-p-phenylenediacrylate (70:70)]

poly[4,4'-cyclopentanone-1,5-diylidenedimethylenebis(3-methoxyphenylene)-co-4,4'-(1,4,5,6,7,7-hexachloro-5-norbornen-2-ylmethylene)diphenylene azelate poly[4,4'-isopropylidenediphenylene cinnamylidenemalonate-co-2,2'-spirobichroman-7,7'-dicarboxylate (25:75)]
poly(1,1'-spirobiindan-5,5'-ylene muconamide)
poly(4,4'-3-phenyl-1-indanylidenediphenylene m-cyclohexadienedicarboxylate)
poly[1,1,3-trimethyl-3-phenyl 5,4'-indandimethylene 1,3-phenylenedimethylidyne-1,1'-bis(4,7-dimethyl-3-indenecarboxylate)]
poly[4,4'-isopropylidenediphenylene 1,4-phenylenediacrylate-co-9,9-dimethyloxanthene-3,6-bis(oxyacetate)
poly[4,4'-hexahydro-4,7-methanoindan-5-ylidenediphenylene 2-(1,2-diphenylcyclopropenyl-3-carbonyloxy)-1,3-propylene ether]
poly[4,4'-hexahydro-4,7-methanoindan-5-ylidenediphenylene 2-cinnamoyloxy-1,3-propylene ether]
poly[4,4'-cyclopentanone-1,5-diylidenedimethylenebis-3-methoxyphenylene-co-4,4'-hexahydro-4,7-methanoindan-5-ylidenediphenylene carbonate]

The preparation of the condensation polymers of the present invention can be accomplished using procedures generally known to those skilled in the art. Useful procedures are found, for example, in the patents cited and incorporated by reference above in relation to the particular light-sensitive or high-temperature-resistant unit. Preferably, the polymers of the present invention are made by low-temperature solution condensation polymerization from the appropriate acid chlorides and bisphenols, preferably in the presence of an acid acceptor such as triethylamine. It is desirable that the condensation polymers of the present invention exhibit an inherent viscosity of from 0.4 to 1.3 dl/g and, most preferably, from 0.6 to 1.1 dl/g. Unless otherwise stated, all inherent viscosities are to be understood as being measured in 1:1 phenol:chlorobenzene (weight ratio) at 25° C. using 0.25 g of polymer per deciliter of solution.

The radiation sensitivity of the polymers of the present invention can be stimulated by incorporating with the polymer a sensitizer. Preferred sensitizers are the coumarin sensitizers described, for example, in *Research Disclosure*, 16145; the heterocyclic, e.g., thiazole, thiazoline, selenazole, and the like sensitizers, of U.S. Pat. No. 2,732,301; and the heterocyclyl-substituted thiazolines and selenazolines of U.S. Pat. No. 4,062,686. Other sensitizers which are well-known in the art can also be used.

A coating composition containing the photocrosslinkable polymers of the present invention can be prepared by dispersing or dissolving the polymer in any suitable solvent or combinations of solvents used in the art to prepare polymer dopes. While the best choice of solvent will vary with the exact polymer and application under consideration, particularly useful solvents are those organic solvents described above.

The optimum concentration of the photocrosslinkable polymers in the coating composition is dependent upon the specific polymer, as well as the support and coating method used. Particularly useful coatings are obtained when the coating solution contains from about 1-50 percent by weight, and preferably about 2-10 percent by weight, of the described photocrosslinkable polymer. Higher and lower concentrations can give satisfactory results.

The sensitizer can be present in the coating composition in any desired concentration effective to stimulate crosslinking in response to radiation. Where a sensitizer is used, it is generally preferred to incorporate it in a concentration of from 0.01-20 percent by weight based on the weight of the photocrosslinkable polymer.

Other addenda can be added to the coating composition. Useful addenda include pigments, dyes, stabilizers to prevent premature crosslinking, and the like.

Elements bearing the photocrosslinkable polymer can be prepared by forming coatings with the coating composition and removing the solvent by drying at ambient or elevated temperatures. Any suitable method can be used to coat the coating compositions described herein, such as spray-coating, dip-coating, hopper-coating, roller-coating, spin-coating and the like.

Suitable support materials can be chosen from a wide variety of materials which are known in the art. Useful supports include fiber-base materials such as paper, polyethylene-coated paper, polypropylene-coated paper and the like; sheets and foils of such metals as aluminum, copper, magnesium, zinc and the like; glass and glass coated with such metals as chromium, chromium alloys and the like; synthetic resins and polymeric materials such as polyester film base (e.g., poly(ethylene terephthalate)); and the like. Particularly useful supports include the described metals and high-temperature-resistant polyester, polycarbonate and polyamide film bases. These latter polymeric materials are polymers containing the high-temperature units described above. A description of the preparation and use of these high-temperature supports can be found in the references relating to the high-temperature-resistant units.

The polymers of the present invention can be used as high-temperature-resistant photoresists. They are particularly useful, for example, where it is desired to etch the support on which they are coated, e.g., copper, with a hot etching solution.

The elements of the present invention having coated thereon a layer of the photocrosslinkable polymers can be exposed by conventional methods. For example, they can be exposed through a transparency or a stencil to an imagewise pattern of actinic radiation which is preferably rich in ultraviolet light. Suitable light sources include carbon arc lamps, mercury vapor lamps, fluorescent lamps, tungsten filament lamps, lasers and the like. The elements of this invention can be handled and viewed in light above about 500 nm in wavelength, as is conventional practice.

The exposed elements having a layer comprising the photocrosslinkable polymer can be developed by contacting the element with a solvent in which the non-crosslinked polymer is soluble. In some cases, it is desirable to reduce the activity of the solvent by admixing it with a less strong solvent or by decreasing the temperature of the development step or by other known methods.

The polymers of the present invention are particularly useful in the formation of color imaging devices. A color imaging device typically comprises a radiation-sensitive surface having superposed thereover a layer of a polymer of the present invention having therein an array of filter elements. The preferred radiation-sensitive surface, over which the described polymer layer having an array of color filters is superposed, is an array of solid-state photosensors. Other useful radiation-sensitive surfaces include, for example, a layer of silver halide. Examples of color imaging devices using a color filter array over a silver halide layer are described in U.S. Pat. Nos. 2,030,163, 1,477,880 and 3,709,693. Another useful radiation-sensitive surface is an array of phosphors such as is used in a color cathode ray tube, examples of which are described in U.S. Pat. Nos. 3,884,695 and 4,019,905.

The preferred surface on which polymers of the present invention are superposed is the radiation-sensitive surface of a semiconductive wafer. This surface typically comprises arrays of charge-handling semiconductive photosensors and bonding pad areas. Bonding pad areas are those areas where electrical contacts are formed on the surface of the wafer. As is well-known in the art, the surface of the wafer can also contain other areas such as dicing lines along which a wafer can be cut, areas referred to as guard bands, and the like. Examples of charge-handling semiconductive photosensors include, for instance, charge-coupled devices (also known as charge-coupled imagers, charge-transfer devices, charge-transfer imagers and the like), charge-injection devices, bucketbrigade devices, diode arrays, combinations of these and the like. Useful semiconductive wafers having surfaces having photosensor arrays are described, for example, in U.S. Pat. No. 3,801,884. Devices of this type are commercially available.

The color filter array is in microregistration in at least one dimension with the underlying array of photosensors. As used herein, the term "microregistration" means that the filter array and the photosensor array are precisely aligned on a micron scale. In other words, the position of the filter array is less than 1 micron away from its intended position with respect to the photosensor array. Further, each filter element is less than 1 micron away from its intended position in the filter array. A single filter element may be superimposed over one photosensor or a group of photosensors.

Using the polymers of the present invention, filter elements of color filter arrays can have very sharply defined edges. Therefore, the dyes in two adjacent filter elements can have little or no overlap. The term "edge sharpness" as used herein means the distance between maximum absorption and minimum absorption at the boundary of a dye deposit and can be measured taking a microdensitometer trace across the dye-deposit boundary using known methods. The edge sharpness of the dye deposits of the present invention is less than about 4 microns and, in preferred embodiments, is less than about 2 microns. Edge sharpness is preferably measured after the filter elements have been formed in the crosslinked portions of the polymer.

Using the polymers of the present invention in conjunction with the method described in U.S. Pat. No. 4,081,277, color filter arrays wherein the individual elements have high densities can be formed in thin layers. Typically, the layers of the polymers of the present invention, when used on solid-state imaging devices, are less than 10 microns thick. Filter elements having densities of 1–1.5 and even higher are possible.

The filter elements of the color filter arrays described herein contain heat-transferable dyes. By this is meant that the dyes are heat-transferable into the polymer. Once diffused into the polymer, however, the dyes need not remain heat-transferable and, in fact, it is preferred that they remain fixed in the layer over a wide range of temperatures.

Various classes of dyes including, for example, azo, anthraquinone, indophenol, indoaniline, perinone, quinophthalone, acridine, xanthone, diazine and oxazine dyes can be diffused into the crosslinkable polymers described above. A partial list of such dyes useful for making color imaging devices of the present invention include, for example:

Eastman Fast Yellow 8GLF
Eastman Brilliant Red FFBL
Eastman Blue GBN
Eastman Polyester Orange 2RL
Eastman Polyester Yellow GLW
Eastman Polyester Dark Orange RL
Eastman Polyester Pink RL
Eastman Polyester Yellow 5GLS
Eastman Polyester Red 2G
Eastman Polyester Blue GP
Eastman Polyester Blue RL
Eastone Yellow R-GFD
Eastone Red B
Eastone Red R
Eastone Yellow 6GN
Eastone Orange 2R
Eastone Orange 3R
Eastone Orange GRN
Eastman Red 901
Eastman Polyester Blue 4RL
Eastman Polyester Red B-LWS
Eastman Turquoise 4G
Eastman Polyester Blue BN-LSW
(all available from Eastman Kodak Company, Rochester, New York).

As is well-known in the art, the color filter arrays of the present invention can take a variety of forms. All of the filter elements can be of a single color or there can be an interlaid pattern of two or more sets of different colored filter elements. The filter elements can take a variety of shapes. Thus, any shape can be conveniently formed, such as rectangular shapes, stripes, circular or triangular elements and the like. Variations can be made in the statistical and spacial relationship of the color filter elements; the relationship between the number of photosensors and the number of filter elements; the degree of overlap of the filter elements and the guard bands—to mention but a few. These variations are well-known in the art. Similarly, the environment in which the described color imaging devices described herein are useful is also well-known in the art, and need not be discussed in detail. For a more detailed discussion of some of these variations, reference is made to U.S. Pat. Nos. 3,971,065, 3,982,274, 4,054,906 and 4,054,915 and *Research Disclosure,* 15916, July, 1977.

A color imaging device described herein can be made by a four-step process. The semiconductive wafer is first coated with a layer of the described polymer. Next, the polymer layer is exposed to a pattern of radiation which represents the bonding pad areas. In the third step, the polymer layer is contacted with a suitable solvent so as to remove the polymer layer in the bonding pad areas. Finally, dye is transferred into the polymer layer so as to form filter elements in microregistration with the underlying photosensors.

The polymer of the present invention can be coated on the semiconductive wafer by any of the methods described above for coating the polymer on any other type of support. A particularly suitable method is to spin-coat the wafer using a solution of the described polymer. This produces a thin, uniform layer. Spin-coating can be repeated to build up a layer of the polymer having the desired thickness. Generally, it is desirable to passivate the semiconductive support by applying a layer of silicon dioxide prior to coating the polymer of the present invention. It may also be desirable to apply a layer of subbing prior to coating the dye-receiving layer, in order to promote adhesion of the receiving layer to the substrate. A suitable subbing layer is described, for example, in U.S. Pat. No. 3,271,345. In a particularly preferred embodiment, the subbing layer is also photocrosslinkable. Where such a subbing layer is used, it can be removed from the bonding pad areas by the solvent and in the development of the dye-receiving polymer without undermining. A useful subbing material for this embodiment is poly[1,4-cyclohexylenebis-(oxyethylene) p-phenylenediacrylate] which is described in U.S. Pat. No. 3,707,373.

In the second step, the polymer is exposed to a pattern of radiation which represents the negative of bonding pad areas. By this is meant that the layer should be exposed to a pattern so that the areas corresponding to the bonding pads are not exposed while the remaining areas, where it is desired to retain the polymer layer, are exposed so as to crosslink the polymer. Thus, the entire radiation-sensitive surface with the exception of areas corresponding to bonding pads, is crosslinked. It may also be desirable to leave unexposed other areas of a semiconductive wafer. For example, it may be desirable in some instances to remove the polymer layer from the dicing line areas, the guard band areas and other areas where the polymer might interfere with subsequent use of the solidstate imaging device.

After exposure of the polymer layer to the appropriate pattern of radiation, uncrosslinked areas are removed by contacting the polymer layer with an organic solvent developer. Thus, the polymer layer can be removed from the bonding pad area, dicing lines, etc. The polymer layer can be contacted with an appropriate solvent by any suitable method such as, for example, by immersing the polymer-coated wafer into a solution which contains the solvent. Alternatively, the wafer can be sprayed with solvent, exposed to vapors of the solvent, or contacted using any other suitable method.

After the polymer layer has been contacted with solvent, and before the color filter array is formed in the remainder of the layer, it has been found desirable to heat the coated wafer at a temperature and for a time period sufficient to remove substantially all of the solvent used in the coating step and in the contacting step, i.e., in the layer-development step. The particular temperature and length of time should be selected based on the materials used. In general, heating at 200° C. for two hours has been satisfactory when using the polymers of the present invention. Heating the dye-receiving layer has been found to improve the effectiveness of the photoresist which is used in subsequent color filter array-forming steps.

After the polymer layer has been developed, heat-transferable dyes are transferred into the polymer layer so as to form filter elements in microregistration with the underlying photosensors. A method which provides necessary resolution for the filter elements of the color filter array involves the successive coating of the layer with photoresist, development of the photoresist, and transferring of the desired dye into the polymer layer through the developed photoresist. This method is described in detail in U.S. Pat. No. 4,081,277, the disclosure of which is incorporated herein by reference.

The following examples are provided to illustrate further the invention.

EXAMPLE 1: The preparation of poly[4,4'-hexahydro-4,7-methanoindan-5-ylidene)-diphenylene terephthalate-co-1,4-phenylenediacrylate 70:30]

Procedure A

To a stirred suspension of 4,4'-(hexahydro-4,7-methanoindan-5-ylidene)bisphenol (64.0 g, 0.2 mole) and dichloromethane (500 ml), a solution of triethylamine (52.5 g, 0.52 mole) in dichloromethane (150 ml) was added and the mixture was stirred at 40° C. for 15 min to give a clear solution. The mixture was then cooled to ice-cold temperature. A mixture of terephthaloyl chloride (28.4 g, 0.14 mole) and 1,4-phenylenediacryloyl chloride (15.3 g, 0.06 mole) in dichloromethane (400 ml) was added to the stirred reaction mixture under anhydrous conditions at such a rate that the temperature of the mixture was kept below room temperature. At the end of the addition of the diacid chloride solution, an additional amount of terephthaloyl chloride (3-4 ml, 5% solution in dichloroethane) was added. An opaque viscous mixture was obtained in about 10 min after the addition of the diacid chloride solution. The mixture was stirred for two and ½ until the mixture was very viscous. The reaction mixture was washed with dilute hydrochloric acid (5%, 300 ml×2), followed by water-washing (500 ml×2). The reaction mixture was added dropwise to methanol (2.5 l) with vigorous stirring. A white fibrous polymer was precipitated. The mixture was filtered and the residue was washed with methanol (250 ml×2), followed by water-washing (500 ml×2) and was dried at 80° C. for 24 hr to give a white fibrous polymer (86.0 g, 92%).

I.V., dl/g = +1.00; Tg, °C. = 312.

Procedure B

A reaction between the same reactants as in Procedure A in the same quantities under similar conditions except that the reaction was performed at room temperature gave a white fibrous polymer.

I.V., dl/g = 0.67; Tg, °C. = 306.

EXAMPLE 2: Preparation of poly[4,4'-(hexahydro-4,7-methanoindan-5-ylidene)-diphenylene terephthalate:1,4-phenylenediacrylate 50:50]

This example was performed as described in Procedure A of Example 1, except the quantities of material shown below were used:

| | |
|---|---|
| terephthaloyl chloride | 10.15 g (0.05 mole) |
| 1,4-phenylenediacryloyl chloride | 12.75 g (0.05 mole) |
| 4,4'-(hexahydro-4,7-methanoindan-5-ylidene)bisphenol | 32.0 g (0.10 mole) |
| triethylamine | 26.2 g (0.26 mole) |
| dichloromethane | 550 ml |

A white fibrous polymer was obtained.

I.V., dl/g = 1.03; Tg, °C. = 304.

EXAMPLE 3: The preparation of a three-color filter array in a polymer layer of the present invention Preparation of Dye-Carrier Papers In a mixture of 40 ml toluene and 10 ml ethanol, 1 g of Eastman Red 901 and 2.5 g of ethyl cellulose were dissolved by stirring with a magnetic stirrer for 4 hr at room temperature. The resulting solution was hand-coated at 0.01″ wet thickness on white paper to produce a red dye-coated paper. Blue dye-coated paper was produced in a similar manner, using a solution which contained 1 g of Eastman Polyester Blue 4RL. Green dye-coated paper was also produced in a similar manner, using a solution which contained 0.6 g Eastman Yellow R-GFD and 0.4 g Eastman Blue GBN.

Preparation of a Three-Color Filter Array

A three-color filter was fabricated on a semiconductive wafer having an array of charge-coupled photosensors according to the procedure which follows:

(1) The semiconductor wafer was spin-coated with a solution of 1 g poly[1,4-cyclohexylenebis(oxyethylene)-p-phenylenediacrylate] dissolved in 20 ml 1,2-dichloroethane at 3000 rpm for 50 sec. This produced a subbing layer of approximately 0.2 micron in thickness.

(2) The wafer was then exposed through a mask which represented the bonding pad areas of the semiconductive wafer for 20 sec on a mask aligner.

(3) The wafer was then spin-coated with a solution containing 5 g of a sample of a polymer described in Example 1, which had an inherent viscosity of 0.89, and, as a sensitizer, 0.5 g of benzanthraquinone dissolved in 50 ml 1,2-dichlorethane at 1500 rpm for 50 sec. This procedure was repeated twice to produce a coating which was approximately 4 microns in thickness.

(4) The semiconductive wafer was then exposed through the bonding pad mask used in step (2) above. Exposure was for 8 min.

(5) The wafer was then immersed in 1,2-dichloroethane for 45 sec to remove the uncrosslinked areas of the dye-receiving polymer applied in step (3) and the subbing applied in step (1). The areas which had received exposure in steps (2) and (4) were substantially unaffected by this treatment.

(6) The wafer was then placed in a drying oven at 200° C. for 2½ hr to remove any residual 1,2-dichloroethane used in coating steps (1) and (3) or development step (5).

(7) The wafer was then spin-coated with a gelatin-based photoresist solution made up of 8 parts by weight of KOPR-TOP Enamel (a registered trademark of Chemco Photo Products Co.) and 1 part by weight of KOPR-TOP Sensitizer (a registered trademark of Chemco Photo Products Co.) at 1000 rpm for 50 sec and air-dried. The wafer was aligned with and exposed through a red-color mask for 20 sec on the mask aligner.

(8) The wafer was then developed in water for 60 sec to remove the uncrosslinked photoresist and was then air-dried.

(9) The red dye-coated paper was placed in contact with the wafer so that the red dye coating was in contact with the developed layer of photoresist. The resulting laminate was then heated at 185° C. for 30 sec in a heated press.

(10) The wafer was then immersed in a 3 molar solution of calcium chloride at 100° C. for 3 min. The photoresist applied in step (7) was then removed by rinsing the wafer with water and squeegeeing with a rubber policeman.

(11) Steps (7), (8), (9) and (10) were repeated except that the blue exposure mask and blue dye-coated paper were used.

(12) Steps (7), (8), (9) and (10) were repeated except that the green exposure mask and green dye-coated paper were used.

The result was a color filter array superposed in microregistration with the charge-coupled photosensors of the underlying semiconductive wafer. The individual filter elements of the color filter array had a density of approximately 1–1.5 in the appropriate regions of the spectrum. The bonding pad areas of the color imaging device were substantially free from dye-receiving polymer and electrical connections could be easily made to these areas, using conventional methods.

EXAMPLE 4

Example 3 was repeated except that separate exposure of the photocrosslinkable subbing (step 2) was omitted. The resulting color filter arrays were of a quality similar to those of Example 3. Electrical connections could still be easily made to the bonding pad areas.

EXAMPLE 5–7

Example 4 was repeated except samples of the following polymers were substituted for the indicated polymer in step (3):

| Example | Polymer | I.V. (dl/g) | Tg (°C.) |
| --- | --- | --- | --- |
| 5 | poly(4,4′-isopropylidene-diphenylene 1,1,3-trimethyl-3-phenyl-5,4′-indandicarboxylate-co-1,4-phenylenediacrylate 70:30) | 0.56 | 246 |
| 6 | poly[4,4′-β-hydro-4,7-methanoindan-5-xylidene)-diphenylene isophthalate,-co-1,4-phenylenediacrylate 70:30] | 0.63 | 275 |
| 7 | poly[4,4′-isopropylidene bis(2,6-dichlorophenylene)isophthalate-co-1,4-phenylenediacrylate 70:30 | 0.79 | 246 |

In each case, the polymer was coated so as to produce a 4-micron layer. The color filter array formed in these dye-receiving polymers were similar to those formed in Example 3. Also, as in Example 3, the bonding pad areas were substantially free from dye-receiving polymer.

The invention has been described in detail with particular reference to certain preferred embodiments thereof, but it will be understood that variations and modifications can be effected within the spirit and scope of the invention.

We claim:

1. A method of producing a color imaging device, said device comprising:
   (a) a semiconductive wafer having a surface comprising:
      (i) an array of charge-handling semiconductive photosensors and
      (ii) bonding pad areas and
   (b) a layer of a polymer superimposed with said surface, wherein said polymer layer:

(i) contains a planar array of filter elements in microregistration with said array of photosensors, wherein each of said elements contains a heat-transferable dye and
(ii) has window areas which correspond with said bonding pad areas, said method comprising the steps of:
(1) coating said surface with a layer of a polymer which is a photocrosslinkable organic solvent-soluble condensation polymer having at least two recurring units and a Tg greater than 200° C., wherein said polymer contains sufficient ethylenically unsaturated, cross-linkable units to render said polymer insoluble in organic solvents on exposure to radiation to which said crosslinkable units are sensitive,
(2) exposing said polymer layer to a pattern of radiation which represents the negative of said bonding pad areas so as to crosslink said polymer layer except in areas corresponding to said bonding pad areas,
(3) contacting said polymer layer with an organic solvent so as to remove said polymer layer in areas corresponding to said bonding pad areas, and
(4) transferring dye into said polymer layer so as to form filter elements in microregistration with said photosensors.

2. The method according to claim 1 which comprises the additional step of heating the coated wafer at a temperature and for a time sufficient to remove substantially all of the solvent used in coating step (1) and contacting step (3).

3. The method according to claim 1 which comprises the additional step of coating said wafer with a photocrosslinkable subbing before said coating step (1).

4. The method according to claim 1 wherein said polymer is a polyester having a Tg greater than 200° C. and represented by the formula:

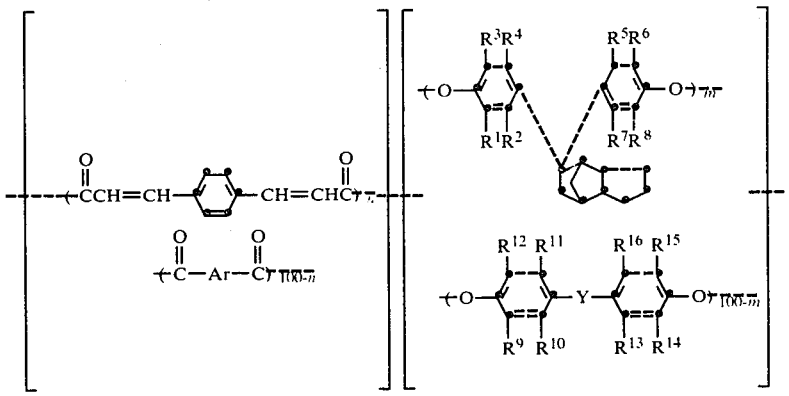

wherein:
the value of n is from 10–100 and of m is from 0–100;

each of $R^1$–$R^{16}$ is independently selected from the group consisting of hydrogen, halogen, cyano, alkyl and alkoxy;

Y represents sulfonyl, oxy, alkylene of 1–4 carbon atoms, alkylidene or cycloalkylidene; and Ar is selected from the group consisting of m-phenylene, p-phenylene, 4,4'-sulfonyldibenzoate, 1,2,3,4-tetrahydro-2,6-naphthalenedicarboxylate, 4,4'-isopropylidenedibenzoate, 1,4-biphenylenedicarboxylate, 2,6-naphthalenedicarboxylate and 1,1,3-trimethyl-3-phenylindan-5,5'-dicarboxylate.

5. The method according to claim 1 wherein said dye is transferred into said polymer layer in step (4) through a developed photoresist.

6. The method according to claim 5 wherein said dye is transferred by placing dye-coated support in contact with said developed photoresist and heating the resulting laminate at a temperature and for a time sufficient to transfer said dye.

* * * * *